United States Patent [19]

Filip

[11] Patent Number: 6,104,232
[45] Date of Patent: Aug. 15, 2000

[54] DC OUTPUT LEVEL COMPENSATION CIRCUIT

[75] Inventor: Jan Filip, Burgdorf, Germany

[73] Assignee: Maxim Integrated Products, Sunnyvale, Calif.

[21] Appl. No.: 09/141,334

[22] Filed: Aug. 27, 1998

[51] Int. Cl.[7] .................................................. H01L 35/00
[52] U.S. Cl. .......................... 327/513; 327/378; 326/126
[58] Field of Search ........................... 326/126; 327/378, 327/512, 513, 560, 561, 562, 563, 108

[56] References Cited

U.S. PATENT DOCUMENTS

| | | | |
|---|---|---|---|
| 3,946,246 | 3/1976 | Marley | 307/218 |
| 4,694,198 | 9/1987 | Umeki | 307/290 |
| 4,745,304 | 5/1988 | Wilson | 307/455 |
| 4,748,346 | 5/1988 | Emori | 307/270 |
| 4,806,796 | 2/1989 | Bushey et al. | 307/455 |
| 4,945,265 | 7/1990 | Estrada | 307/455 |
| 5,072,136 | 12/1991 | Naghshineh | 307/455 |
| 5,291,075 | 3/1994 | Hollstein et al. | 307/443 |
| 5,323,068 | 6/1994 | Freitas | 307/455 |
| 5,969,579 | 10/1999 | Hartke et al. | 323/116 |

*Primary Examiner*—Jeffrey Zweizig
*Attorney, Agent, or Firm*—Hickman Stephens Coleman & Hughes, LLP

[57] ABSTRACT

Disclosed is a circuit and method for compensating DC output level variations in a differential emitter-coupled logic circuit. The DC output level compensating differential emitter-coupled logic circuit includes a differential pair, an output stage, and a compensation circuit. The differential pair is configured to receive a differential signal and is operative to generate a differential signal. The output stage is coupled to the differential pair to receive the differential signal and is operative to generate a differential output signal at a DC output voltage level. The compensation circuit is coupled to the differential pair and the output stage and is operative to develop a compensating voltage drop in the differential pair so as to compensate for a change in the DC output voltage level when the temperature varies such that the output stage outputs the differential output signal at the DC output voltage level.

69 Claims, 3 Drawing Sheets

DC OUTPUT LEVEL COMPENSATION CIRCUIT

FIELD OF THE INVENTION

The present claimed invention relates to the field of DC level compensating circuits. More particularly, the present claimed invention relates to DC level compensating circuits for transistors.

BACKGROUND ART

Modern integrated circuit (IC) chips typically contain millions of transistors on a single chip. With the speed of some IC chips operating at over a gigahertz (GHz), one of the persistent problems facing IC chip design is the adverse effects of temperature on the performance of the devices (e.g., transistors, resistors, etc.) embedded in the chip. For example, the devices in the IC chips typically produce heat during operation of the circuit. In some cases, the heat generated from the devices can increase the overall temperature of the chip in the order of several hundred degrees.

The temperature increase in an IC chip environment adversely affects the performance of the circuit. For example, a temperature increase typically increases switching time of transistors in an IC chip because electrical conductivity is inversely proportional to temperature. That is, a higher temperature usually slows down the speed of devices in the integrated chip whereas a lower temperature speeds up the devices.

In addition to temperature variations, integrated circuits may also suffer from process variations. One of the main causes of the process variation is non-uniform base-emitter voltages of bipolar junction transistors. For example, during manufacturing processes, non-uniform doping concentrations may produce bipolar junction transistors that have varying base-emitter voltages. Higher base-emitter voltages speed up and improve conductivity of the transistors while lower threshold voltages slow down and reduce conductivity of the transistors. The variation in the process therefore introduces variation in speed and conductivity of transistors in integrated circuits.

In general, the temperature and process variations affect IC chips that run at high speeds more than chips that operate at lower speeds. This is because devices operating at a high switching speed produce more heat than the devices running at a lower speed. Thus, high speed IC chips are more sensitive to variations in temperature and process.

Since the invention of the IC devices, the speed of IC chips has been steadily increasing by implementing faster switching circuits. One of the fastest IC is emitter-coupled logic (ECL) circuit with propagation delay of less than 1 nanosecond and clock rates over 1 GHz. ECL circuits are often used in high speed digital logic circuits. To operate at such high speeds, the differential ECL circuit requires low capacitive load at load resistors to avoid parasitic filtering. Unfortunately, the differential ECL circuit is typically highly sensitive to variations in temperature and process. In particular, the DC output level of the ECL circuit changes with the variation in temperature and process.

Prior Art FIG. 1 illustrates a conventional temperature compensation circuit 102 for compensating temperature variations in an ECL circuit 100 through DC level compensation. The ECL circuit 100 comprises transistors N1, N2, N3, N4, N5, and N6, load resistors 106 and 108, an emitter series feedback resistor 110, and a reference voltage network 104. The ECL circuit 100 receives two input signals I1 and I2 at the base of the transistors N1 and N2, respectively. The reference voltage network 104 provides a bias voltage to the bases of the transistors N3 and N4. The transistors N5 and N6 form output follower transistors for providing outputs O1 and O2 at the respective emitters.

The temperature compensation circuit 102 comprises a pair of diodes D1 and D2 coupled in parallel and a resistor 112. The resistor is coupled in series to the parallel coupled diodes D1 and D2. In this setting, the diodes D1 and D2 operate to allow current in one direction at a time between junctions 116 and 118. The compensation circuit 102 provides DC level compensation to the output transistors N5 and N6 by adjusting current flow through the load resistors 106 and 108.

Unfortunately, the temperature compensation circuit 102 presents several drawbacks. For example, the compensation circuit also affects the AC operations of the ECL circuit 100 with a resulting adverse effect on the high speed signal. Furthermore, the compensation circuit 102 causes a large capacitive load due to a large current that can flow through the diodes D1 and D2. This means that the diodes D1 and D2 must be large enough to handle such large current. This, in turn, leads to bandwidth reduction. In addition, the compensation circuit 102 is not operative to start compensation at a specified temperature and is generally not process independent since the circuit is not symmetrical.

Thus, what is needed is a DC level compensating circuit that provides a substantially constant DC voltage level at the output transistor of a differential ECL circuit by compensating for variations in temperature and process without affecting AC operation. What is also needed is a compensation circuit having low capacitive load to allow high frequency applications in ECL circuits.

SUMMARY OF THE INVENTION

Broadly speaking, the present invention fills these needs by providing a circuit and method for compensating DC output voltage level for a transistor. It should be appreciated that the present invention can be implemented in numerous ways, including as a process, an apparatus, a system, a device, or a method. Several inventive embodiments of the present invention are described below.

In one embodiment, the present invention provides a DC output level compensating differential emitter-coupled logic circuit. The DC output level compensating differential emitter-coupled logic circuit includes a differential pair, an output stage, and a compensation circuit. The differential pair is configured to receive a differential signal and is operative to generate a differential signal. The output stage is coupled to the differential pair to receive the differential signal and is operative to generate a differential output signal at a DC output voltage level. The compensation circuit is coupled to the differential pair and the output stage and is operative to develop a compensating voltage drop in the differential pair so as to compensate for a change in the DC output voltage level when the temperature varies such that the output stage outputs the differential output signal at the DC output voltage level.

In another embodiment, the present invention provides a method for compensating output DC voltage level variations in a transistor. The method includes: (a) generating a first constant reference voltage at a node coupled to the transistor, the first constant reference voltage being independent of temperature; (b) developing a compensating current through a resistor, which is coupled to the transistor at the node; and (c) developing a compensating voltage drop across the resistor that is coupled to the transistor at the node, wherein the compensating voltage drop compensates for a change in the DC output voltage level due to a change in temperature such that the DC output voltage level of the transistor remains substantially constant.

In yet another embodiment, the present invention provides a circuit for compensating a change in base-emitter voltage of an output transistor, which has a base, an emitter, and a collector. The output transistor is coupled to a load resistor and receives an input signal at the base for output at the emitter. The circuit includes a voltage generating circuit, an emitter series resistor, and a compensating transistor. The voltage generating circuit is coupled to a temperature independent constant voltage rail and is operative to develop a temperature independent constant voltage. The compensating transistor is coupled to the load resistor and the base of the output transistor. The compensating transistor is further coupled to the emitter series resistor and is coupled to receive the temperature independent constant voltage. The compensating transistor is operative to develop a compensating current to cause a compensating voltage drop in the load resistor. The compensating voltage drop compensates for the change in the base-emitter voltage of the output transistor such that the output transistor outputs the input signal at a substantially constant DC output voltage level.

In another embodiment, the present invention provides a circuit for compensating a change in base-emitter voltage of a transistor having a base, an emitter, and a collector. The transistor is coupled to a first resistor at a node and receives an input signal at the base for output at the emitter. The circuit includes voltage generating means and compensating means. The voltage generating means generates a temperature independent constant voltage. The compensating means coupled to the first resistor and the transistor at the node. The compensating means receives the temperature independent constant voltage for developing a compensating current to cause a compensating voltage drop in the first resistor. The compensating voltage drop compensates for the change in the base-emitter voltage of the transistor such that the transistor outputs the input signal at a substantially constant DC output voltage level.

Advantageously, the present invention provides a substantially constant DC output voltage level by compensating for variations in temperature and/or process in the output transistor. The present invention also allows decoupling of the compensation circuit to provide a constant DC output voltage level over wide temperature range and process variation. In addition, the compensation circuit of the present invention provides low capacitive load to allow high frequency applications in ECL circuits. Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

DESCRIPTION OF THE PREFERRED EMBODIMENTS

In the following detailed description of the present invention providing a circuit and method for compensating DC output voltage level, numerous specific details are set forth in order to provide a thorough understanding of the present invention. However, it will be obvious to one skilled in the art that the present invention may be practiced without these specific details. In other instances, well known methods, procedures, components, and circuits have not been described in detail so as not to unnecessarily obscure aspects of the present invention.

Figure 1:
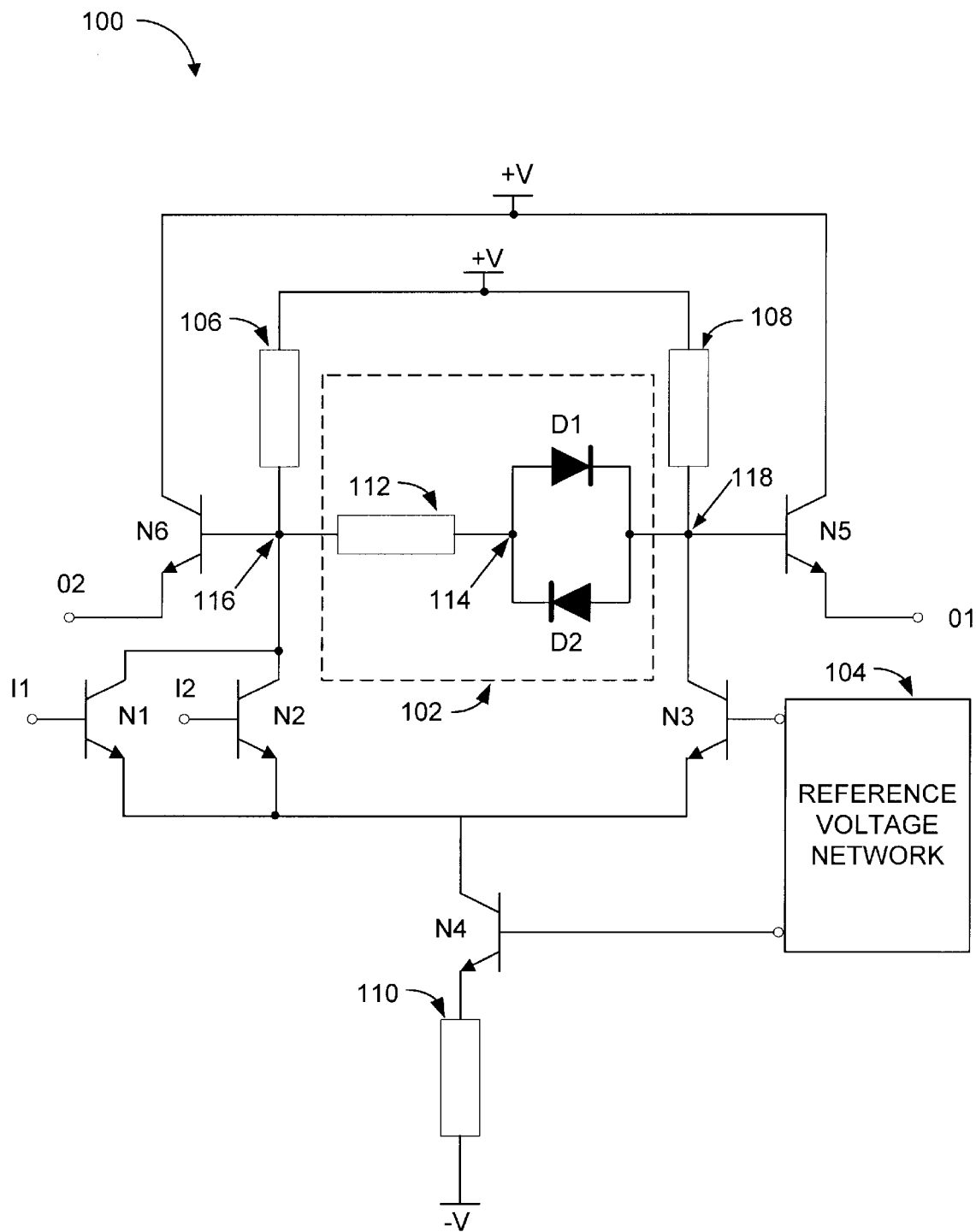
FIG. 1 illustrates a conventional temperature compensation circuit for compensating temperature variations in an ECL circuit through DC level compensation.
Figure 2:
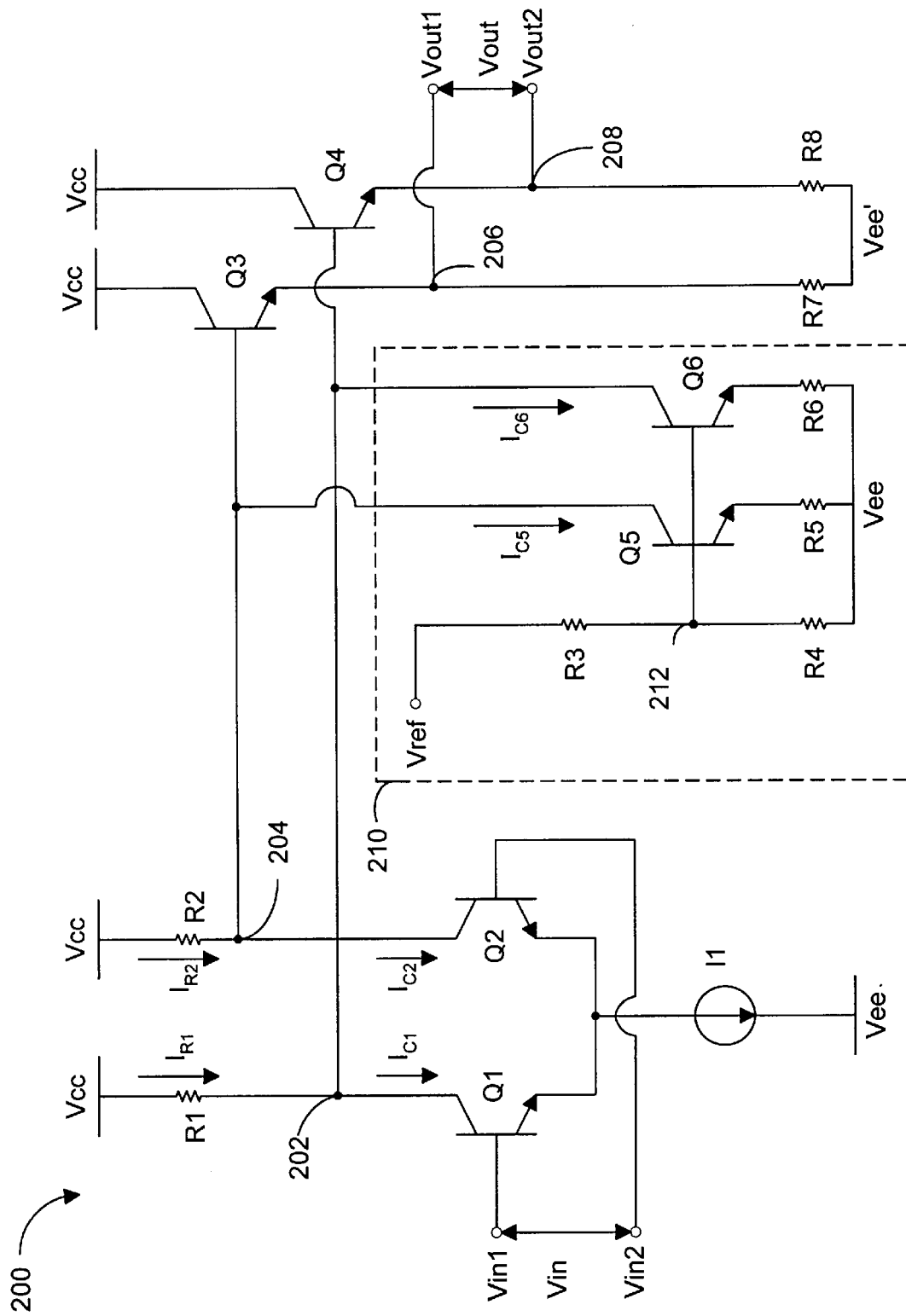
FIG. 2 illustrates a differential ECL circuit including a DC level compensation circuit in accordance with one embodiment of the present invention.

FIG. 2 illustrates a differential ECL circuit 200 including a DC level compensation circuit 210 in accordance with one embodiment of the present invention. The differential ECL circuit 200 includes an input stage, an output stage, and the compensation circuit 210. The input stage includes a differential amplifier, a pair of load resistors R1 and R2, and a DC current source I1.

The differential amplifier includes a pair of transistors Q1 and Q2, which are preferably bipolar junction transistors having an emitter, a collector, and a base. The emitters of the transistors Q1 and Q2 are coupled to each other to form an emitter-coupled transistor pair. The bases of the transistors Q1 and Q2 are operative to receive a differential signal Vin. Specifically, the transistor Q1 receives an input signal $Vin_1$ at its base and the transistor Q2 receives an input signal $Vin_2$ at its base. The difference between the input signals $Vin_1$ and $Vin_2$ received at the bases of the transistors Q1 and Q2, respectively, define the differential signal Vin. Preferably, the transistors Q1 and Q2 are matching transistors. Although the present invention employs npn transistors, it may also utilize pnp transistors.

The constant current source I1 is coupled between a supply voltage rail Vee and emitters, i.e., common-emitters, of the transistors Q1 and Q2. Preferably, the current source I1 is a temperature dependent DC current source and is operative to sink a constant DC current through either transistors Q1 or Q2. The DC current source is temperature dependent so as to compensate for a change in resistance over temperature to provide a constant current. This leads to constant voltage drops across the load resistors R1 and R2. The constant DC current is switched between the transistors Q1 and Q2 of the differential amplifier in response to the differential signal Vin. For example, when the transistors Q1 is turned on and the transistor Q2 is turned off by the differential signal Vin, the current source I1 draws current through the transistor Q1.

The resistors R1 and R2 are coupled between the collectors of the transistors Q1 and Q2, respectively, and a supply voltage rail Vcc. Preferably, the resistors R1 and R2 are matching resistors characterized by substantially identical resistance values. In this arrangement, the emitter coupled transistor pair, Q1 and Q2, receives the input signals Vin1 and Vin2 and is operative to provide currents, $Ic_1$ and $Ic_2$, through the load resistors R1 and R2, respectively. The currents $Ic_1$ and $Ic_2$ cause voltage drops across the resistors R1 and R2 and thus generate voltages at nodes 202 and 204, respectively. In this manner, the differential amplifier generates a differential ECL output voltage swing at the nodes 202 and 204.

The output stage includes a pair of output buffers operative to shift the DC voltage levels of the nodes 202 and 204 and output the differential ECL output voltage swing of nodes 202 and 204 as output signal Vout. The output buffers are implemented as an emitter-follower pair, which includes a pair of transistors Q3 and Q4. The transistors Q3 and Q4 are preferably matching transistors and are bipolar junction transistors having an emitter, a collector, and a base. The collectors of the transistors Q3 and Q4 are coupled to the supply voltage rail Vcc. In one embodiment, the transistors Q3 and Q4 are npn transistors.

The output stage also includes a pair of resistors R7 and R8, which are coupled between a supply voltage rail Vee' and the emitters of the transistors Q3 and Q4, respectively. In the preferred embodiment, the resistors R7 and R8 are matching resistors having substantially identical resistance values. In one embodiment, the resistors R7 and R8 are both 50 Ω resistors and the voltage rail Vee' is 2 volt below the supply voltage rail Vcc. Although the present invention uses such resistor values and voltage values, it should be appreciated that the present invention can also be implemented using other suitable resistor values and supply voltage levels.

The bases of the transistors Q3 and Q4 are coupled to receive the voltage signals at the nodes 202 and 204, respectively, for driving the voltage signals for output. That is, the transistors Q3 and Q4 generates output signals Vout1 and Vout2, respectively, at output nodes 206 and 208. In this fashion, the differential ECL voltage as the output signal Vout, which is defined as the difference between the output signals $Vout_1$ and $Vout_2$.

The compensation circuit 210 is coupled to the nodes 202 and 204 and is operative to draw current from the currents $I_{R1}$ and $I_{R2}$ through the load resistors R1 and R2, respectively, to compensate for DC level changes caused by temperature and/or process variations in the output buffers (e.g., transistors Q3 and Q4). Specifically, the compensation circuit 210 compensates for the temperature and process variation of emitter-base voltages ($V_{BE}$) of the emitter-follower transistors Q3 and Q4.

The compensation circuit 210 includes a pair of common-base transistors Q5 and Q6, a pair of emitter-series feedback resistors R5 and R6, and a pair of voltage divider resistors R3 and R4. The transistors Q5 and Q6 are bipolar transistors having an emitter, a collector, and a base. In addition, the transistors Q5 and Q6 are preferably matching transistors having substantially matching emitter areas. In one embodiment, the transistors Q5 and Q6 are both npn transistors. Even though the present invention employs such transistors, it may also utilize other suitable transistors such as pnp transistors.

The common-base transistors Q5 and Q6 are coupled to each other at their bases. The resistors R5 and R6 are coupled between the supply voltage rail Vee and the emitters of the transistors Q5 and Q6, respectively. The collectors of the transistors Q5 and Q6 are coupled to the nodes 202 and 204, respectively. In one embodiment, the resistors R5 and R6 are preferably matching resistors having substantially identical resistance values.

The voltage divider resistors R3 and R4 are coupled in series between a constant reference voltage source Vref and the voltage rail Vee. The node at which the resistors R3 and R4 are coupled to each other is defined as a node 212. The common bases of the transistors Q5 and Q6 are coupled to the node 212. In one embodiment, the reference voltage source Vref is a constant voltage source so as to provide a constant voltage independent of temperature and process. In another embodiment, the reference voltage source Vref provides a constant voltage independent of temperature.

To simplify explanations in the operation of the circuit 200, several assumptions are made. First, the base currents of all transistors in the circuit 200 are assumed to be negligible so that the emitter and collector currents of the transistors in the circuit 200 are approximately equal. Second, the differential pair provides a substantially over temperature constant voltage drop across the load resistors R1 and R2. Those skilled in the art will readily recognize that these approximations typically yield results that substantially conform to results in practice.

To compensate for temperature dependence of base-emitter voltages ($V_{BE}$) of the output transistors Q3 and Q4, the present invention provides an additional current through the load resistors R1 and R2 of the differential amplifier. In operation, the voltage divider resistors R3 and R4 shifts the reference voltage Vref down and sets up a constant voltage at the node 212 through a voltage divider effect. Since the reference voltage source Vref is a constant voltage source independent of temperature and process, the voltage thus generated up at the node (e.g., common-base) across the resistor R4 is also independent of temperature and process. The common bases of the transistors Q5 and Q6 are connected to the constant voltage set up at the node 212. The base-emitter voltages of the transistors Q5 and Q6 are dependent on variations in temperature and process. Since a collector current typically varies in relation to the base current of a transistor, the collector currents of the transistors Q5 and Q6 are also dependent on the variations in temperature and process of the transistors Q5 and Q6. Hence, the voltage drops across the resistors R5 and R6 depend on the base-emitter voltages ($V_{BE}$) of the transistors Q5 and Q6, respectively.

The temperature and process dependent collector currents of the transistors Q5 and Q6 provides the compensation currents through the load resistors R1 and R2. Specifically, the collector currents of the transistors Q5 and Q6, which are approximately equal to the emitter currents, are converted to a compensation voltage through the load resistors R1 and R2. The compensation voltages across the load resistors R1 and R2 are then superimposed with the differential voltage caused by the collector output currents Ic1 and Ic2 of the differential pair transistors Q1 and Q2, respectively. The changes in the base-emitter voltages $V_{BE3}$ and $V_{BE4}$ are compensated by the temperature dependent voltage drop or rise across the load resistors R2 and R1, respectively.

For example, when the $V_{BE3}$ rises in response to a rise in temperature, the voltage across the load resistor R2 drops to compensate for the increased DC level of the $V_{BE3}$ caused by the temperature rise so that the sum of the voltage drop across the resistor R2 and the $V_{BE3}$ is a constant value. Similarly, when the $V_{BE3}$ decreases with a drop in temperature, the voltage across the load resistor R2 rises to compensate for the decrease in the $V_{BE3}$ so that the total voltage drop across the resistor R2 and the $V_{BE3}$ remains a constant value. In this manner, the variations in the base-emitter voltages of the transistors Q3 and Q4 due to the variations in temperature and process are compensated by the changes in the voltages at the nodes 202 and 204.

By way of example, when the base-emitter voltage $V_{BE3}$ of the transistor Q3 changes with temperature, the base-emitter voltage $V_{BE5}$ of the compensating transistor Q5 also changes over the temperature. Hence, the voltage across the resistor R5 also changes over the temperature. The transistor Q5 provides a compensating current Ic5 through the resistor R2. This compensating current Ic5 causes a compensating voltage drop across the load resistor R2, thereby compensating for the change in the base-emitter voltage $V_{BE3}$ of the transistor Q3. For instance, In one embodiment, the resistors R2 and R5 are selected to provide an optimum base-emitter voltage compensation as mentioned below.

It should be noted that the differential ECL circuit 200 includes two symmetrical branches. The first branch of the circuit 200 includes the transistors Q1, Q4, and Q6, and resistors R1, R8, and R6. The second branch of the circuit 200 is symmetrical to the first branch and includes the transistors Q2, Q3, and Q5, and resistors R2, R7, and R5. The current source I1 and the voltage divider resistors coupled to both the first and second branches. The temperature and process compensation of the base-emitter voltages of the output buffer transistors Q3 and Q4 operates for each of the individual branches.

Similarly, the compensation circuit 210 also includes two symmetrical branches. The first branch of the compensation circuit 210 includes the transistor Q6 and the resistor R6. The second branch of the compensation circuit 210 includes the transistor Q5 and the resistor R5. Both branches may share the voltage divider resistors R3 and R4.

It should be appreciated that the compensation scheme of the present invention may also work in a single-ended circuit. For example, the first branch of the compensating circuit 210 may work individually with the first branch of the ECL circuit 200 without the presence of the second branches. Likewise, the second branch of the compensating circuit 210 may work with the second branch of the ECL circuit 200 without using the first branches.

Analytically, the temperature and process compensation in the base-emitter voltages of the transistors Q3 and Q4 may be explained with reference to one of the branches of the differential ECL circuit 200. The DC voltage level at the output port associated with the output signal Vout1 is described by the following equation, where $V_{BE3}$ and $V_{BE5}$ are the base-emitter voltages of the transistors Q3 and Q5, respectively:

$$Vout1 = (Ic2 + Ic5) * R2 + V_{BE3} \quad (1)$$

$$= Ic2 * R2 + Ic5 * R2 + V_{BE3}$$

$$= Ic2 * R2 + R2 * (VR5 / R5) + V_{BE3}$$

$$= R2 * Ic2 + \frac{R2}{R5} * \left(\frac{R4}{R4 + R3} * Vref - V_{BE5}\right) + V_{BE3}$$

Then, a temperature coefficient of the DC voltage level at the output port can be describes as:

$$\frac{\partial Vout1}{\partial T} = \quad (2)$$

$$\frac{\partial (R2 * Ic2)}{\partial T} + \frac{\partial}{\partial T} * \frac{R2}{R5} * \left(\frac{R4}{R4 + R3} * Vref - V_{BE5}\right) + \frac{\partial V_{BE3}}{\partial T}$$

The equation (2) describing the changes in Vout1 as a function of changes in temperature shows that the temperature change of as follows, where $-R2/R5$ is a common mode gain factor:

$$\frac{\partial Vout1}{\partial T} = -\frac{R2}{R5} * \frac{\partial V_{BE5}}{\partial T} + \frac{\partial V_{BE3}}{\partial T} \quad (3)$$

Equation (3) shows that the temperature change of $V_{BE3}$ and the temperature coefficient of $V_{BE5}$ are of opposite polarity. In particular, equation (3) indicates that the changes in the base-emitter voltage of the transistor Q3 caused by variations in temperature may be compensated by the changes in the base-emitter voltage of the compensating transistor Q5 together with the appropriate selection of the resistors R2 and R5 to satisfy the ratio R2/R5. In other words, if the product of the common mode gain factor, $-R2/R5$ with the temperature coefficient of the base-emitter voltage $V_{BE5}$ equals the temperature coefficient of the base-emitter voltage $V_{BE3}$, the DC output level of the transistor Q3 is fully compensated.

For example, if the temperature coefficient of $V_{BE3}$ is 10 mV per degree centigrade and the temperature coefficient of $V_{BE5}$ is 5 mV per degree centigrade, then the selection of resistors R2 and R5 such that the resistance value of the resistor R2 is twice that of the resistor R5 provides a circuit that compensates for the variations in the $V_{BE3}$ due to temperature. Hence, the values of the resistors R2 and R5 can be designed to compensate for the changes in the $V_{BE3}$. This compensation scheme operates for the other branch of the differential ECL circuit 200 in a similar manner. In one embodiment, the compensation scheme of the present invention utilizes matching devices as described previously, By using matching devices, the variations in processes are compensated also.

Figure 3:
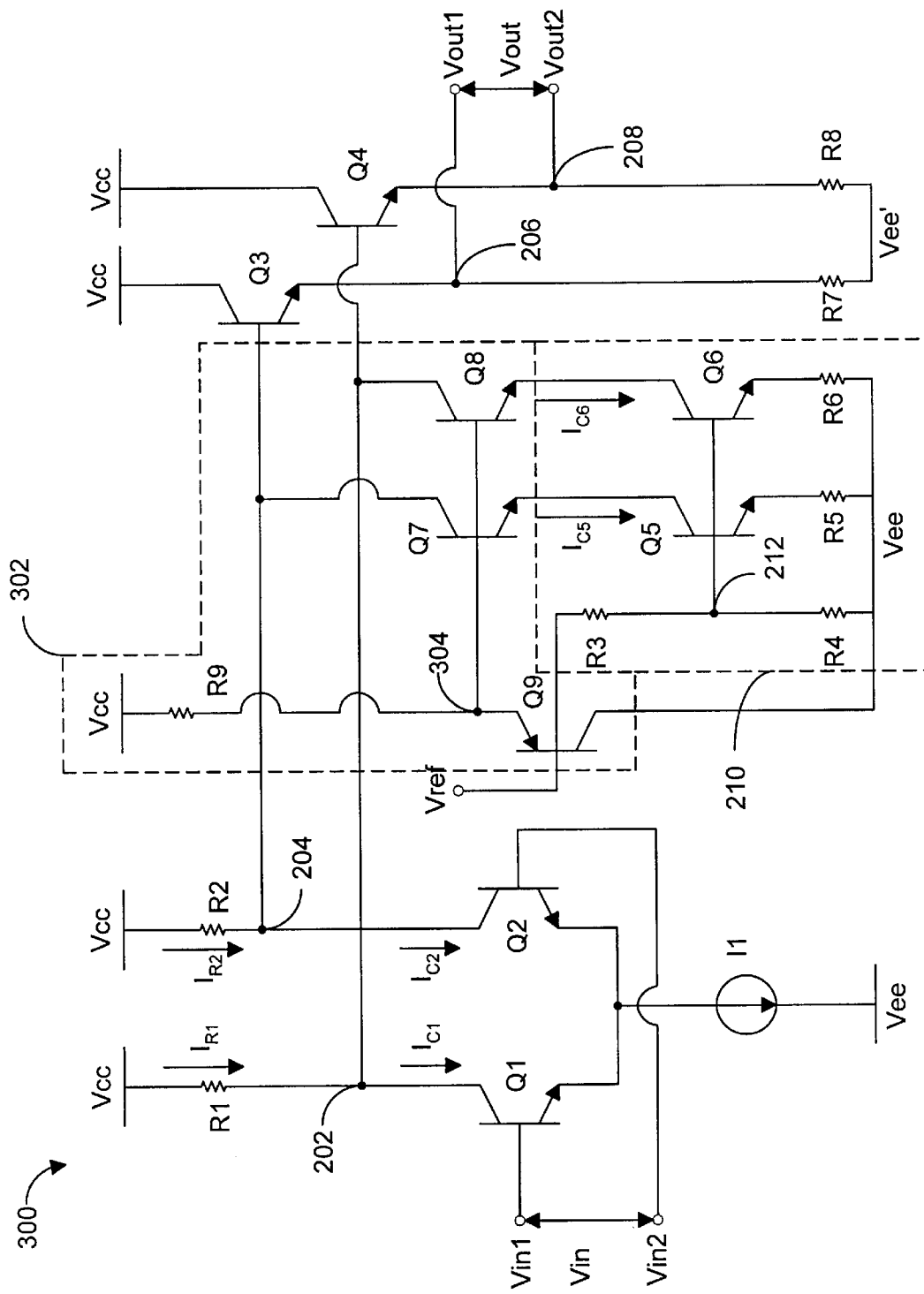
FIG. 3 illustrates the differential ECL circuit including a cascode stage for decoupling the compensation circuit in accordance with one embodiment of the present invention.

FIG. 3 illustrates a differential ECL circuit 300 including a cascode stage 302 for decoupling the compensation circuit in accordance with one embodiment of the present invention. The differential ECL circuit 300 is identical to the ECL circuit 200 of FIG. 2 with the exception of the cascode stage 302. The temperature and process compensation of the ECL circuit 300 operates as described above in conjunction with FIG. 2.

The cascode stage 302 depicted in FIG. 3 is operative to decouple the compensation transistors Q5 and Q6 from the rest of the ECL circuit 300. The cascode stage 302 provides constant collector emitter voltages for the compensation transistors Q5 and Q6. The constant collector and emitter voltages for the transistors Q5 and Q6 ensure that the compensation current is independent on the output level of the differential amplifier as well as on the power supply voltages.

The cascode stage 302 includes a pair of matching transistors Q7 and Q8. The transistors Q7 and Q8 are preferably bipolar transistors, which include a base, an emitter, and a collector. The collectors of the transistors Q7 and Q8 are coupled to the nodes 204 and 202, respectively. The bases of the transistors Q7 and Q8 are coupled together in a common-base arrangement to the node 304. The emitters of the transistors Q7 and Q8 are coupled to the collectors of the transistors Q5 and Q6, respectively.

A resistor R9 is coupled between the supply voltage rail Vcc and the node 304. A transistor Q9 is coupled to the Vref at its base. The transistor Q9 is a bipolar transistor, preferably a pnp transistor, having an emitter, a collector, and a base. The emitter of the transistor Q9 is coupled to the common-base node 304 and the collector is coupled to the supply voltage rail Vee.

The cascode stage 302 decouples the transistors Q5 and Q6 from the rest of the differential ECL circuit 300 so as to insulate the transistors Q5 and Q6 from a transient swing at the output ports. The transistor Q9 is a emitter-follower and is preferably a bipolar transistor. The transistor Q9 is a pnp emitter follower and the resistor R9 is an emitter-series feedback degeneration resistor, which defines the collector current of the transistor Q9. The transistor Q9 shifts the voltage at the node 304 up by its base-emitter voltage, $V_{BE9}$, from the reference voltage Vref supplied at its base. In turn, the transistors Q7 and Q8 shifts the voltage level down by the respective base-emitter voltages $V_{BE7}$ and $V_{BE8}$. Accordingly, the transistors Q7 and Q8 decouples the transistors Q5 and Q6 and provides the reference voltage Vref to the collector nodes of the transistors Q5 and Q6.

In addition, by decoupling the transistors Q5 and Q6, the cascode stage 302 allows the compensation circuit 210 to operate independent of changes in power supply voltage. For example, when the supply voltages (e.g., Vcc, Vee, Vee') change, the voltages at the collectors of the transistors Q5 and Q6 also change in response. The variation of voltages at the collectors are due to undesirable early voltage effect typically associated with a transistor. The cascode stage 302 including the emitter follower transistor Q9 effectively eliminates the undesirable early voltage effects by maintaining the voltages at the collectors of the transistors Q5 and Q6 at a proper operating voltage. Furthermore, the cascode stage 302 also enables use of large devices by decoupling parasitic capacitance of the large device transistors.

Advantageously, the present invention provides a substantially constant DC output voltage level by compensating for variations in temperature and/or process in the output transistor. The cascode stage also allows decoupling of the compensation circuit to provide a substantially constant DC output voltage level over a wide temperature range and process variation. In addition, the compensation circuit of the present invention provides low capacitive load to allow high frequency applications in ECL circuits.

While the present invention has been described in terms of several preferred embodiments, there are alterations, permutations, and equivalents which fall within the scope of this invention. It should also be noted that there are alternative ways of implementing both the method and apparatus of the present invention. It is therefore intended that the following appended claims be interpreted as including all such alterations, permutations, and equivalents as fall within the true spirit and scope of the present invention.

What is claimed is:

1. A DC output level compensating differential emitter-couple logic circuit, comprising:

a differential pair configured to receive a differential signal and operative to generate a differential signal;

an output stage coupled to the differential pair to receive the differential signal and being operative to generate a differential output signal at a DC output voltage level; and a compensation circuit coupled to the differential pair and the output stage, the compensation circuit being operative to develop a compensating voltage drop in the differential pair so as to compensate for a change in the DC output voltage level when the temperature varies such that the output stage outputs the differential output signal at the DC output voltage level, the compensation circuit including a cascode stage.

2. The circuit as recited in claim 1, wherein the specified DC output voltage level remains constant when the temperature varies.

3. The circuit as recited in claim 1, wherein the differential pair further comprises:

a first transistor pair including a first transistor and a second transistor;

a load resistor pair including a first load resistor and a second load resistor, the first and second load resistors being coupled to the first and second transistors, respectively; and a current source coupled to the first transistor pair for switching a current through one of the transistors, the current source being temperature dependent to provide a constant current that compensates for a change in resistance of the first and second transistors over variation in the temperature.

4. The circuit as recited in claim 3, wherein the first transistor and the second transistors are bipolar transistors, each transistor having a base, an emitter, and a collector.

5. The circuit as recited in claim 4, wherein the first and second transistors are coupled to each other to form an emitter-coupled transistor pair.

6. The circuit as recited in claim 4, wherein the first and second transistors are npn transistors.

7. The circuit as recited in claim 4, wherein the first and second resistors are coupled to the collectors of the first and second transistors, respectively.

8. The circuit as recited in claim 3, wherein the first and second resistors are coupled to a first supply voltage rail and the current source is coupled to a second voltage rail such that the current flows between the first supply voltage rail and the second voltage rail.

9. The circuit as recited in claim 4, wherein the differential signal is applied at the bases of the first and second transistors.

10. The circuit as recited in claim 1, wherein the output stage further comprises:

an emitter-follower pair including a third transistor and a fourth transistor, the third and fourth transistors generating the differential output signal at the DC output voltage level that varies as the temperature varies; and a first emitter-follower resistor pair including a third resistor and a fourth resistor, the third and fourth resistors being coupled to the third and fourth transistors, respectively.

11. The circuit as recited in claim 10, wherein the third transistor and the fourth transistors are bipolar transistors, each transistor having a base, an emitter, and a collector.

12. The circuit as recited in claim 11, wherein the third and fourth resistors are coupled to the emitters of the third and fourth transistors, respectively.

13. The circuit as recited in claim 11, wherein the third and fourth transistors are npn transistors.

14. The circuit as recited in claim 12, wherein the third and fourth resistors are coupled to a third supply voltage rail and the collectors of the third and fourth transistors are coupled to the first supply voltage rail.

15. The circuit as recited in claim 14, wherein the voltage of the third supply voltage rail is 2 volt less than the first supply voltage rail.

16. The circuit as recited in claim 11, wherein the differential output voltage is generated at the emitters of the third and fourth transistors.

17. The circuit as recited in claim 1, wherein the compensation circuit is operative to develop a compensating current through the differential pair, the compensating current causing the compensating voltage drop in the differential pair, wherein the compensating voltage drop compensates for the change in the DC output voltage level so that the DC output voltage level remains substantially constant.

18. The circuit as recited in claim 3, wherein the compensating current comprises a first compensating current and a second compensating current, wherein the compensation circuit further comprises:

a first compensating transistor coupled to the first load resistor and being operative to develop the first compensating current to cause a first compensating voltage drop in the first load resistor of the differential pair; and a second compensating transistor coupled to the second load resistor and being operative to develop the second compensating current to cause a second compensating voltage drop in the second load resistor of the differential pair.

19. The circuit as recited in claim 18, wherein the first and second compensating transistors are bipolar junction transistors, each transistor having a base, a collector, and an emitter.

20. The circuit as recited in claim 19, wherein the compensation circuit provides a temperature independent constant voltage at the bases of the first and second compensating transistors.

21. The circuit as recited in claim 20, wherein the compensation circuit further includes a voltage divider circuit coupled to a temperature independent constant voltage source and being operative to develop the temperature independent constant voltage.

22. The circuit as recited in claim 21, wherein the voltage divider circuit includes a fifth resistor and a sixth resistor coupled in series to the temperature independent supply voltage rail, the fifth resistor and the sixth resistor being coupled to each other at a junction, which is coupled to the bases of the first and second compensating transistors, wherein the voltage divider circuit develops the temperature independent constant voltage at the junction.

23. The circuit as recited in claim 19, wherein the first and second compensating transistors and the third and fourth transistors are matching transistors so that the specified DC output voltage level remains constant with respect to process variations.

24. The circuit as recited in claim 19, wherein the first and second compensating transistors and the third and fourth transistors have matching emitter areas.

25. The circuit as recited in claim 3, wherein the load resistors are matching resistors.

26. The circuit as recited in claim 21, wherein the compensation circuit further includes:
 a first emitter series feedback resistor coupled to the emitter of the first compensation transistor; and
 a second emitter series feedback resistor coupled to the emitter of the second compensation transistor.

27. The circuit as recited in claim 19, wherein the first and second compensating transistors are npn bipolar junction transistors.

28. The circuit as recited in claim 11, wherein the change in the DC output voltage level corresponds to a change in base emitter voltages of the third and fourth transistors so that the compensating voltage compensates for the change in the base emitter voltages of the third and fourth transistors.

29. A DC output level compensating differential emitter-coupled logic circuit, comprising:
 a differential pair comprising:
  a first transistor pair including a first transistor and a second transistor;
  a load resistor pair including a first load resistor and a second load resistor, the first and second load resistors being coupled to the first and second transistors, respectively; and
  a current source coupled to the first transistor pair for switching a current through one of the transistors, the current source being temperature dependent to provide a constant compensating current, comprising a first compensating current and a second compensating current, that compensates for a change in resistance of the first and second transistors over variation in the temperature;
 wherein the differential pair is configured to receive a differential signal and is operative to generate a differential signal;
 an output stage coupled to the differential pair to receive the differential signal and being operative to generate a differential output signal at a DC output voltage level; and
 a compensation circuit coupled to the differential pair and the output stage, the compensation circuit comprising:
  a first compensating transistor coupled to the first load resistor and being operative to develop the first compensating current to cause a first compensating voltage drop in the first load resistor of the differential pair;
  a second compensating transistor coupled to the second load resistor and being operative to develop the second compensating current to cause a second compensating voltage drop in the second load resistor of the differential pair;
  a voltage divider circuit coupled to a temperature independent constant voltage source and being operative to develop a temperature independent constant voltage; and
  a cascode stage operative to provide constant voltages between the collectors and the emitters of each of the first and second compensation transistors;
 wherein the first and second compensating transistors are bipolar junction transistors, each transistor having a base, a collector, and an emitter, wherein the temperature independent constant voltage is provided at the bases of the first and second compensating transistors, the compensation circuit being operative to develop a compensating voltage drop in the differential pair so as to compensate for a change in the DC output voltage level when the temperature varies such that the output stage outputs the differential output signal at the DC output voltage level.

30. The circuit as recited in claim 29, wherein the cascode stage operates to decouple the compensation circuit such that the first and second compensating currents are independent of the output signal.

31. The circuit as recited in claim 29, wherein the cascode stage operates to decouple the compensation circuit such that the first and second compensating currents are independent of the supply voltages.

32. The circuit as recited in claim 29, wherein the cascode stage includes:
 a first cascode transistor coupled between the collectors of the first transistor and the first compensating transistor and being operative to provide a constant voltage between the collector and the emitter of the first compensating transistor; and
 a second cascode transistor coupled between the collectors of the second transistor and the second compensating transistor and being operative to provide a constant voltage between the collector and the emitter of the second compensating transistor.

33. The circuit as recited in claim 32, wherein the first and second cascode transistors are bipolar junction transistors having a base, a collector, and an emitter, wherein the cascode stage further includes:
 an emitter follower transistor coupled to each of the bases of the first and second cascode transistors to provide a shifted voltage that is shifted from the temperature independent supply voltage rail, wherein the first and second cascode transistors shift the shifted voltage such that the first and second cascode transistors provides each of the first and second compensating transistors with the shifted voltage.

34. A method for compensating output DC voltage level variations in at least one compensated transistor, comprising:

providing a first compensated transistor;

providing a first load resistor coupled to the first compensated transistor at a first node;

providing a first compensating transistor coupled to the first node and a second node;

providing a first temperature independent constant reference voltage;

providing a first voltage dividing resistor coupled to the first temperature independent constant reference voltage and a second node;

providing a second voltage dividing resistor coupled to the second node;

generating, by the first and second voltage dividing resistors, a second temperature independent constant reference voltage at the second node coupled to the first compensating transistor;

developing, by the first compensating transistor, a first compensating current through the first load resistor; and developing a first compensating voltage drop across the first load resistor that is coupled to the first compensated transistor at the first node, the first compensating voltage drop compensating for a change in the DC output voltage level due to a change in temperature such that the DC output voltage level of the first compensated transistor remains substantially constant.

35. The method as recited in claim 34, wherein the first compensating transistor is a bipolar junction transistor, having a base, an emitter, and a collector, the base being coupled to the second node, the collector being coupled to the first node.

36. The method as recited in claim 34, wherein the first compensating voltage drop compensates for the change in the DC output voltage level due to a variation in the temperature of the first compensated transistor.

37. The method as recited in claim 36, wherein the first compensated transistor is a bipolar junction transistor having a base, an emitter, and a collector, wherein the variation in the temperature causes a base-emitter voltage of the first compensated transistor to change such that the first compensating voltage drop compensates for the change in the base-emitter voltage of the first compensated transistor.

38. The method as recited in claim 37, further comprising:

providing a second compensating transistor coupled to the second node and a third node;

providing a second compensated transistor coupled to the second compensating transistor at the third node;

providing a second load resistor coupled to the third node;

developing, by the second compensating transistor, a second compensating current through the second load resistor;

developing a second compensating voltage drop across the second load resistor that is coupled to the second compensated transistor at the third node, the second compensating voltage drop compensating for a change in the DC output voltage level due to a change in temperature such that the DC output voltage level of the second compensated transistor remains substantially constant; and wherein the first and second compensating transistors and the first and second compensated transistors are matching transistors so as to compensate for variations in process.

39. The method as recited in claim 37, wherein the first compensated transistor is an output transistor and the first load resistor is coupled to the base of the first compensated transistor at the first node.

40. A circuit that includes compensation for a change in base-emitter voltage of at least one output transistor, comprising:

a first output transistor, having a base, an emitter, and a collector, the first output transistor being coupled to a first load resistor and receiving a first input signal at the base for output at the emitter;

a voltage generating circuit coupled to a temperature independent constant voltage rail and being operative to develop a temperature independent constant voltage;

a first emitter series resistor; and a first compensating transistor coupled to the first load resistor and the base of the first output transistor, the first compensating transistor being coupled to the first emitter series resistor and being coupled to receive the temperature independent constant voltage and being operative to develop a first compensating current to cause a first compensating voltage drop in the first load resistor, the first compensating voltage drop compensating for the change in the base-emitter voltage of the first output transistor such that the first output transistor outputs the input signal at a substantially constant DC output voltage level.

41. The circuit as recited in claim 40, wherein the base-emitter voltage of the first output transistor changes in response to a change in temperature.

42. The circuit as recited in claim 41, further comprising a second output transistor, each of the first and second output transistors being a bipolar junction transistor having a base, an emitter, and a collector.

43. The circuit as recited in claim 42, further comprising:

a second load resistor coupled to the base of the second output transistor.

44. The circuit as recited in claim 43, wherein the first and second load resistors are matching resistors.

45. The circuit as recited in claim 44, further comprising:

a second compensating transistor coupled to the second load resistor and being operative to develop a second compensating current to cause a second compensating voltage drop in the second load resistor.

46. The circuit as recited in claim 45, wherein the voltage generating circuit provides the temperature independent constant voltage at the bases of the first and second compensating transistors.

47. The circuit as recited in claim 46, wherein the voltage generating circuit is a voltage divider circuit including a first resistor and a second resistor coupled in series to the temperature independent constant voltage rail, the first and second resistors being coupled to each other at a junction, which is coupled to the bases of the first and second compensating transistors, wherein the voltage divider circuit develops the temperature independent constant voltage at the junction.

48. The circuit as recited in claim 45, further comprising a cascode stage operative to provide constant voltages between the collectors and the emitters of each of the first and second compensating transistors.

49. The circuit as recited in claim 48, wherein the cascode stage operates to decouple the first and second compensating transistors such that the first and second compensating currents are independent of the output signal.

50. The circuit as recited in claim 48, wherein the cascode stage operates to decouple the first and second compensating transistors such that the first and second compensating currents are independent of the supply voltages.

51. The circuit as recited in claim 48, where in the cascode stage includes:
a first cascode transistor coupled between the first load resistor and the collector of the first compensating transistor, the first cascode transistor being operative to provide a first constant voltage between the collector and the emitter of the first compensating transistor; and
a second cascode transistor coupled between the second load resistor and the collector of the second compensating transistor, the second cascode transistor being operative to provide a second constant voltage between the collector and the emitter of the second compensating transistor.

52. The circuit as recited in claim 51, wherein the first and second cascode transistors are bipolar junction transistors having a base, a collector, and an emitter, wherein the cascode stage further includes:
an emitter follower transistor coupled to each of the bases of the first and second cascode transistors to provide a shifted voltage that is shifted from the temperature independent supply voltage rail, wherein the first and second cascode transistors shift the shifted voltage such that the first and second cascode transistors provides each of the first and second compensating transistors with the shifted voltage.

53. The circuit as recited in claim 45, wherein the first and second compensating transistors and the first and second output transistors are matching transistors so that the DC output voltage level of the first and second output transistors remains constant with respect to process variations.

54. The circuit as recited in claim 45, wherein the first and second compensating transistors and the first and second output transistors have matching emitter areas.

55. The circuit as recited in claim 45, further comprising:
the first emitter series resistor being coupled to the emitter of the first compensating transistor; and
a second emitter series resistor coupled to the emitter of the second compensating transistor, wherein the first and second emitter series resistors are matching resistors.

56. The circuit as recited in claim 45, wherein the change in the DC output voltage level corresponds to a change in base-emitter voltages of the first and second output transistors so that the first and second compensating voltages compensate for the changes in the base-emitter voltages of the first and second output transistors, respectively.

57. A circuit that includes compensation for a change in base-emitter voltage of at least one output transistor, comprising:
a first output transistor having a base, an emitter, and a collector, the first output transistor being coupled to a first load resistor at a first node and receiving an input signal at the base for output at the emitter;
voltage generating means for generating a temperature independent constant voltage; and
compensating means coupled to the first load resistor and the first output transistor, the compensating means being coupled to the first load resistor at the first node and being further coupled to receive the temperature independent constant voltage for developing a first compensating current to cause a first compensating voltage drop in the first load resistor, the first compensating voltage drop compensating for the change in the base-emitter voltage of the first output transistor such that the first output transistor outputs the input signal at a substantially constant DC output voltage level.

58. The circuit as recited in claim 57, wherein the base-emitter voltage of the first output transistor changes in response to a change in temperature.

59. The circuit as recited in claim 58, further comprising a second output transistor, each of the first and second output transistors being a bipolar junction transistor having a base, an emitter, and a collector.

60. The circuit as recited in claim 59, further comprising:
the first load resistor being coupled to the base of the first output transistor; and
a second load resistor coupled to the base of the second output transistor, wherein the first and second load resistors are matching resistors.

61. The circuit as recited in claim 60, wherein the compensation means further comprises:
a first compensating transistor coupled to the first load resistor and being operative to develop the first compensating current to cause a first compensating voltage drop in the first load resistor; and
a second compensating transistor coupled to the second load resistor and being operative to develop a second compensating current to cause a second compensating voltage drop in the second load resistor.

62. The circuit as recited in claim 61, further comprising decoupling means for decoupling the compensating means such that the first and second compensating currents are independent of the output signal.

63. The circuit as recited in claim 62, wherein the first and second compensating currents are independent of the supply voltages.

64. The circuit as recited in claim 62, wherein the decoupling means further includes:
a first cascode transistor coupled between the first load resistor and the collector of the first compensating transistor, the first cascode transistor being operative to provide a first constant voltage between the collector and the emitter of the first compensating transistor; and
a second cascode transistor coupled between the second load resistor and the collector of the second compensating transistor, the second cascode transistor being operative to provide a second constant voltage between the collector and the emitter of the second compensating transistor.

65. The circuit as recited in claim 64, wherein the first and second cascode transistors are bipolar junction transistors having a base, a collector, and an emitter, wherein the decoupling means further includes:
an emitter follower transistor coupled to each of the bases of the first and second cascode transistors to provide a shifted voltage that is shifted from the temperature independent supply voltage rail, wherein the first and second cascode transistors shift the shifted voltage such that the first and second cascode transistors provides each of the first and second compensating transistors with the shifted voltage.

66. The circuit as recited in claim 61, wherein the first and second compensating transistors and the first and second output transistors are matching transistors so that the DC output voltage level of the first and second output transistors remains constant with respect to process variations.

67. The circuit as recited in claim 61, wherein the first and second compensating transistors and the first and second output transistors have matching emitter areas.

68. The circuit as recited in claim 61, wherein the compensating means further includes:
a first emitter series resistor coupled to the emitter of the first compensating transistor; and a second emitter series resistor coupled to the emitter of the second compensating transistor, wherein the first and second emitter series resistors are matching resistors.

69. The circuit as recited in claim 61, wherein the change in the DC output voltage level corresponds to a change in base-emitter voltages of the first and second output transistors so that the first and second compensating voltages compensate for the changes in the base-emitter voltages of the first and second output transistors, respectively.

* * * * *